US009411341B2

(12) United States Patent
Lee et al.

(10) Patent No.: US 9,411,341 B2
(45) Date of Patent: Aug. 9, 2016

(54) VACUUM PUMP CONTROLLER

(71) Applicant: GLOBALFOUNDRIES Singapore Pte. Ltd., Singapore (SG)

(72) Inventors: Chin Fong Lee, Singapore (SG); Ming Zhu, Singapore (SG); Chuin Boon Yeap, Singapore (SG)

( * ) Notice: Subject to any disclaimer, the term of this patent is extended or adjusted under 35 U.S.C. 154(b) by 382 days.

(21) Appl. No.: 13/900,542

(22) Filed: May 23, 2013

(65) Prior Publication Data

US 2013/0317640 A1  Nov. 28, 2013

Related U.S. Application Data

(60) Provisional application No. 61/651,534, filed on May 24, 2012.

(51) Int. Cl.
| | |
|---|---|
| *G05D 7/00* | (2006.01) |
| *G05D 7/06* | (2006.01) |
| *F04D 19/04* | (2006.01) |
| *F04D 27/02* | (2006.01) |
| *H01L 21/67* | (2006.01) |

(52) U.S. Cl.
CPC .............. *G05D 7/0617* (2013.01); *F04D 19/04* (2013.01); *F04D 27/02* (2013.01); *H01L 21/67259* (2013.01); *H01L 21/67276* (2013.01)

(58) Field of Classification Search
CPC ................... H01L 21/67201; H01L 21/67276; H01L 21/6773; H01L 21/28202; G05B 2219/45031
See application file for complete search history.

(56) References Cited

U.S. PATENT DOCUMENTS

| | | | | |
|---|---|---|---|---|
| 6,591,851 | B1* | 7/2003 | Palten | F04D 19/04 137/12 |
| 8,874,274 | B2* | 10/2014 | McDonald | H04L 12/403 62/55.5 |
| 2004/0013531 | A1* | 1/2004 | Curry | F04D 27/0261 417/42 |
| 2007/0107598 | A1* | 5/2007 | Lee | H01L 21/67196 96/74 |
| 2008/0273995 | A1* | 11/2008 | Bailey | F04D 27/0292 417/279 |
| 2009/0216061 | A1* | 8/2009 | Clark et al. | B01D 53/005 588/313 |
| 2010/0106992 | A1* | 4/2010 | Schauer | G05B 19/41865 713/323 |
| 2010/0190343 | A1* | 7/2010 | Aggarwal | C30B 25/16 438/694 |
| 2011/0220342 | A1* | 9/2011 | Page | G05D 23/1917 165/279 |
| 2012/0090338 | A1* | 4/2012 | Czerniak | B01D 53/79 62/91 |

* cited by examiner

*Primary Examiner* — Darrin Dunn
(74) *Attorney, Agent, or Firm* — Horizon IP Pte. Ltd.

(57) ABSTRACT

A vacuum pump controller and a method of making a devise using the same are presented. The vacuum pump controller comprises detectors for detecting whether a cassette is present in a semiconductor processing load lock; and controllers for sending control signals to a vacuum pump to control the speed voltage of the vacuum pump. The vacuum pump controller may further send control signals to control the supply of $N_2/H_2$ gas, cooling water and other vacuum pump accessories.

20 Claims, 4 Drawing Sheets

VACUUM PUMP CONTROLLER

BACKGROUND

Vacuum pumps and abetment tools are ubiquitously used in semiconductor processing for ensuring a clean and specific processing environment as well as for controlling and regulating various gas flows at specific vacuum pressure and waste gas treatment.

In semiconductor processing, as the need to prioritize energy increases, the energy reduction effort does not include just energy reduction in the process but also energy reduction in the process equipment. Vacuum pumps and abetment tools play an important role among process equipment in semiconductor processing.

Hence, the reduction of the energy used by a vacuum pump and abetment tools would help reduce the energy in a process and the vacuum pump controller plays an important role as to the energy used by a vacuum pump and abetment tools. In addition, the controller also controls the vacuum pump and abetment tools, including hydrogen fuel/nitrogen purge gas flows and/or exhaust diversion, thereby playing a role in maximizing energy saved.

From the foregoing, it is desirable to provide an improved controller for reducing energy from pump speed and purge or dilution gas flows and exhaust air into subfab apparatus or accessories (e.g. vacuum pump, dry or wet abetment) during semiconductor processing.

SUMMARY

Embodiments generally relate to a vacuum pump controller. The vacuum pump controller includes detectors for detecting whether a cassette is present in a semiconductor processing load lock, and controllers for sending control signals to a vacuum pump to control the speed voltage of the vacuum pump. The vacuum pump controller may further send control signals to control the supply of $N_2$ and $H_2$ gas and cooling water.

In another embodiment, a method of making a device includes providing a substrate; processing the substrate using a vacuum pump having a vacuum pump controller, wherein the vacuum pump controller includes detectors for detecting whether a cassette is present in a semiconductor processing load lock, and controllers for sending control signals to a vacuum pump to control the speed voltage of the vacuum pump. The controllers may further send control signals to control the supply of $N_2$ and $H_2$ gas and cooling water.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

DESCRIPTION

Embodiments generally relate to a vacuum pump controller. The vacuum pump controller in one embodiment is a speed voltage controller. In another embodiment, the vacuum pump controller may control the speed voltage of the vacuum pump as well as fuel or purge or dilution gases supplied to the vacuum pump and abetment tools. Vacuum pumps and abetment tools are generally located in the subfab level to save space on the fab level thereby allowing more space for the main tool and the vacuum chamber on the fab level. The vacuum pumps may have built-in variable speed and valves for controlling the supply of the gases; alternatively, the variable speed and controlling valves may be separately installed and connected to the vacuum pump to achieve the desired functions.

In another embodiment, where the original equipment comes with its own software, such software may be modified to include the needed functions, such as variable speed and valves for controlling supply of gases, and the modified outputs connected to the vacuum pump controller. This intelligent software, which may include micro-processor and control hardware, can be designed and built into a separate module and then interfaced with the main equipment thru' additional wiring connecting to the subfab apparatus or accessories (e.g. vacuum pump, dry or wet abetment).

Alternatively, the intelligent software may be built into the main equipment using internal micro-processor and control hardware and software, and connects thru' additional wiring to the subfab apparatus or accessories. Both designs provide an improved controller for reducing energy from pump speed and purge or dilution or fuel gas flows and exhausts air into subfab apparatus or accessories. Application consideration depends largely on cost, software/hardware and available equipment space.

In one embodiment, the vacuum pump controller has detectors for detecting when a semiconductor processing process is in idle mode by checking for the presence of a cassette in a load lock or a cassette pot SMIF arm or FOUP load port. If a cassette or cassette pot is present, the vacuum pump controller will send a signal to activate the vacuum pump to process the load lock at the full speed of the DC source, for example, at about 5V.

At full speed, the working current may be about 6.9 A or higher and the pump rotation speed may be about 5500 rpm. If the vacuum pump controller detects that there is no cassette in the load lock or cassette pot, the controller will send a signal to activate the vacuum pump to process the load lock in idle mode and switch to a lower voltage, for example 2.5V, to reduce a rotating speed of the vacuum pump to conserve electricity. At 2.5V, the working current may be about 4.8 A or lower with the lower pump rotation speed being about 3300 rpm. Simultaneously, extended control signals from the vacuum pump controller can also be utilized to activate subfab apparatus or accessories into energy saving mode.

Figure 1:
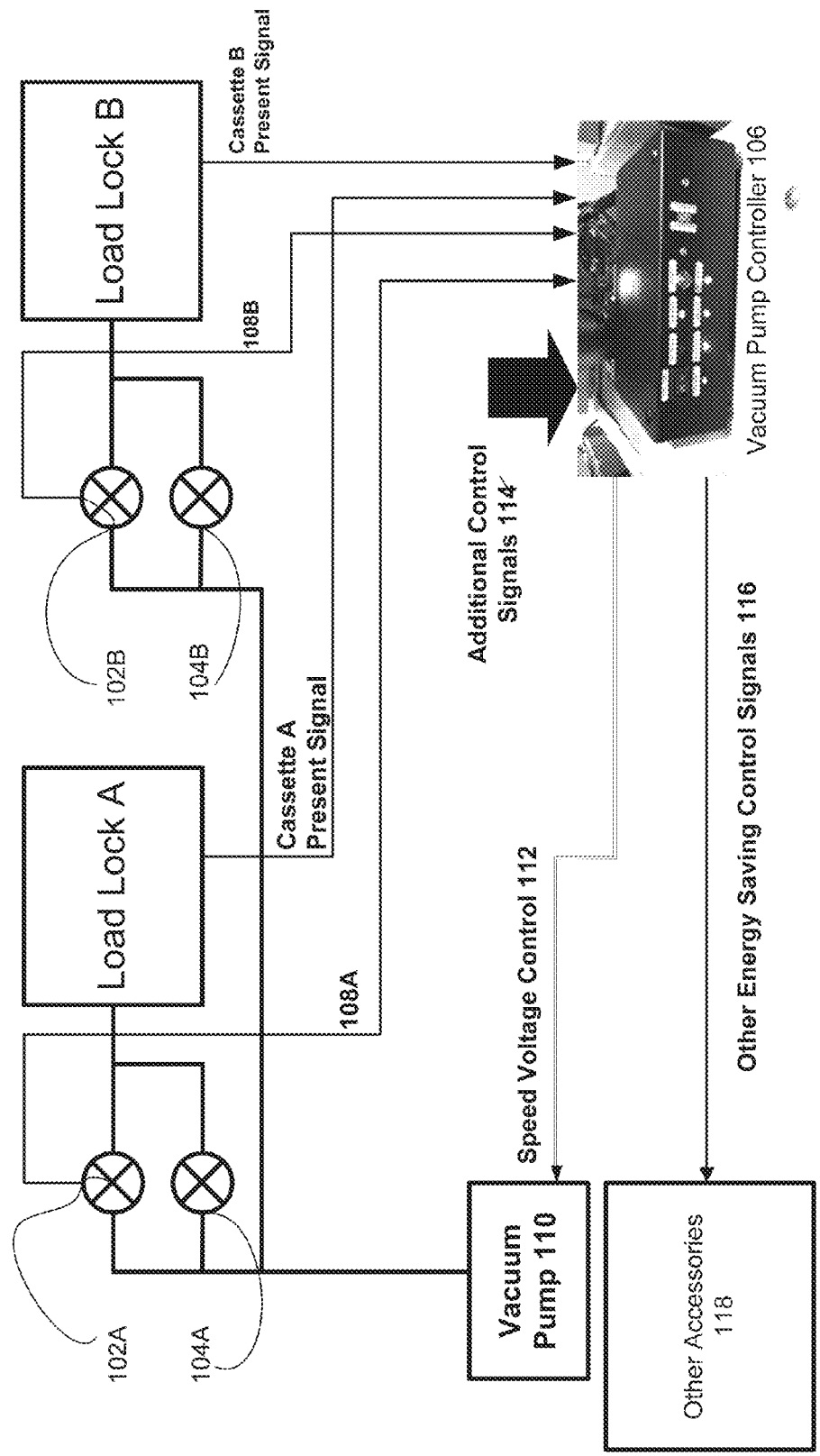
FIG. 1 shows a functional block diagram of an embodiment of a vacuum pump controller.

FIG. 1 shows a functional block diagram of an embodiment of a vacuum pump controller. As shown, the diagram has 2 load loads, i.e., load lock A and load lock B. In other embodiments, more than 2 load locks may also be useful. As shown, load lock A is connected to a fast pump valve 102A and a slow pump valve 104A and load lock B is connected to a fast pump valve 102B and a slow pump valve 104B. Slow pump valves 104A and 104B are small entry valves, while fast pump valves 102A and 102B are big entry valves. The slow pump valves 104A and 104B are used up to a certain base pressure before switching over to fast pump valves 102A and 102B to avoid air turbulence until the specific vacuum base pressure required for the wafer transfer is reached.

In one embodiment, vacuum pump controller 106 has a low or idle default state. When a cassette is loaded into load lock A and/or load lock B, detectors in the vacuum pump controller 106 will detect a cassette A present signal from load lock A and/or a cassette B present signal from load lock B. In addition, detectors in vacuum pump controller 106 will detect a signal 108A from fast pump valve A and/or a signal 108B from fast pump valve B to confirm that cassettes are present in load lock A and/or load lock B. In one embodiment, if vacuum pump 110 is shared with both load lock A and B and other accessories, only one of the load locks or accessories is permitted to be pump down at any given time.

If detection of either 208A or cassette A present signal or 208B or cassette B present signal is received, controllers in the vacuum pump controller 106 will send a control signal 112 to the vacuum pump to ramp up the vacuum pump speed to e.g., at about 5V (full speed) before the load lock pump down. In one embodiment, 108A/cassette A present signal and 108B/cassette B present signal works in pair. Such a configuration serves to avoid random triggering of vacuum pump speed and/or subfab accessories from unreliable signals during wafer processing. As the door closing and SMIF arm retraction time for the load lock is about 1 to 1.5 minutes, the controllers in vacuum pump controller 106 will send the control signal 112 to ramp up the vacuum pump 110 approximately one minute in advance of the load lock pump down.

Vacuum pump controller 106 may further detect additional control signals 114. For example, a physical vapour deposition (PVD) machine may have more than two fast pump valves. Alternatively, in other tool types, for example, a (CVD) machine may have 5 load ports and therefore five FOUP load port. In this case, additional control signals can be added to the detection until limited by circuitry design. The vacuum pump controller 106 may send other energy saving control signals 116 to other accessories 118. For example, accessories may include an Abetment tool, $H_2$ fuel/$N_2$ purge gas and/or heater. Controllers in the vacuum pump controller 106 may control the other accessories 118 by sending valve or digital signals to activate the accessories. This may result in the control of, for example, the inflow of $H_2$ fuel and/or $N_2$ purges gas and/or cooling water. Control of other types of accessories may also be useful.

Figure 2:
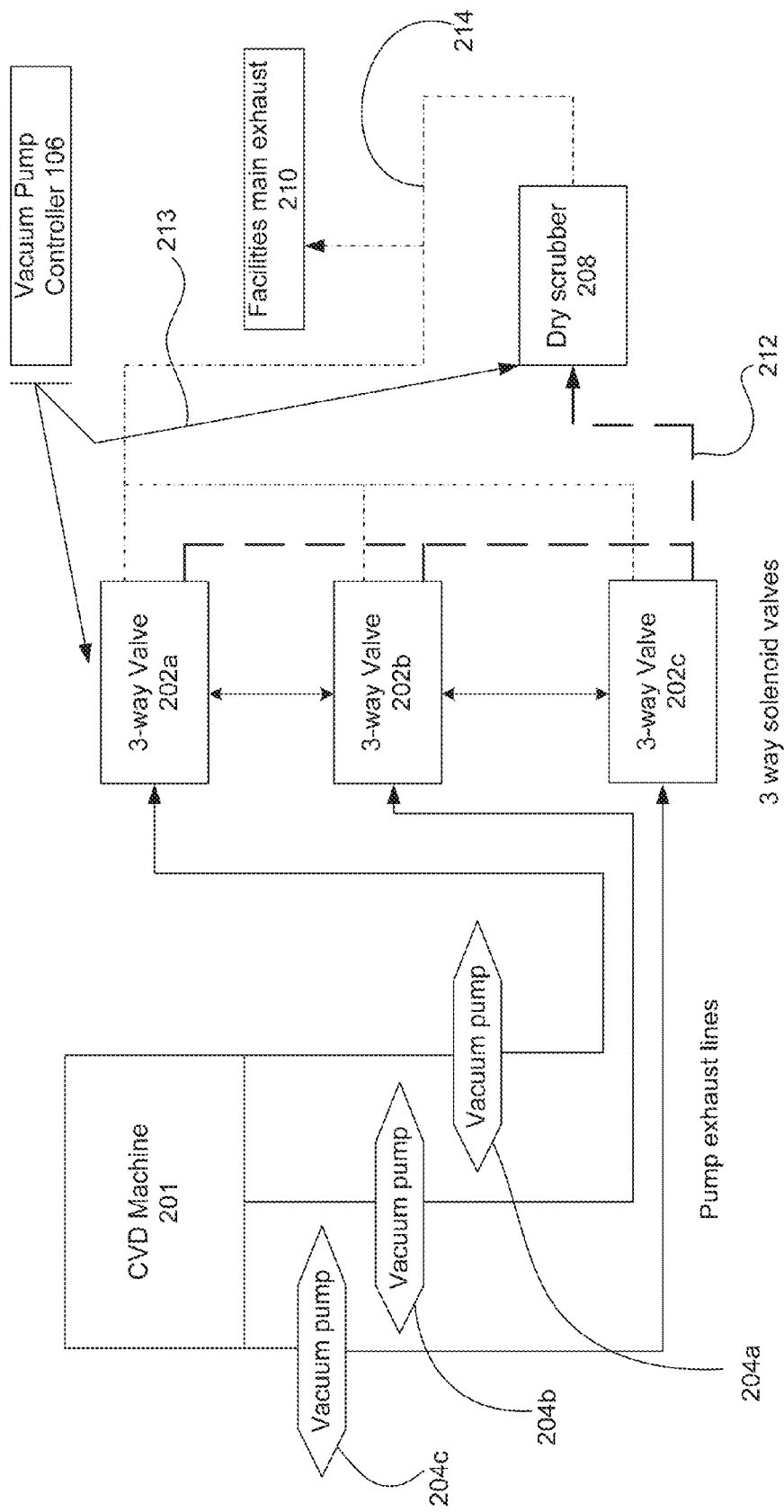
FIG. 2 shows a functional block diagram of how an embodiment of the vacuum pump controller reduces the energy consumption of a dry scrubber.

FIG. 2 shows a functional block diagram of how an embodiment of the vacuum pump controller reduces the energy consumption of a dry scrubber. As shown, an exhaust diversion or 3-way solenoid valve 202a-c may be included with each vacuum pump 204a-c for diverting the waste gas and/or purge gas to the appropriate outlet. Although the drawing shows a CVD machine 201 with 3 vacuum pumps 204a-c and therefore 3 exhaust diversions or 3-way valves 202a-c, the vacuum pump controller 106 may also be used with other CVD machines having other numbers of vacuum pump and associated numbers of 3-way valves. As mentioned before, the 3-way valves 202a-c may be built-in or separately installed to the vacuum pumps 204a-c.

Referring to FIG. 2, when the vacuum pump controller 106 detects that a wafer is present, the controller will activate the 3-way valves 202a-c to divert the waste and/or purge gas from the vacuum pumps 204a-c along a flow path 212 to the dry scrubber 208 for treatment by the dry scrubber before release into the atmosphere via the main exhaust 210 along a flow path 214. The vacuum pump controller 106 may also send signal 213 to control the flow of $N_2$ and $H_2$ gas into the dry scrubber; the $N_2$ gas for diluting the poisonous and/or flammable and /or corrosive and/or non abatable gases emitted during processing that is being processed by the dry scrubber 208, and the $H_2$ gas for increasing the temperature of the dry scrubber 208 to get rid of the more poisonous and/or environmentally unfriendly gas, such as oxidizer gases.

If the vacuum pump controller 106 detects that no wafer is present, the controller 106 will activate the 3-way valves 202a-c to bypass the dry scrubber 208 and release the non abatable waste/purge gas along the flow path 214 directly to the main exhaust 210. Where $N_2$ gas is supplied for diluting the poisonous and/or flammable and/or corrosive and/or non abatable gas and $H_2$ gas supplied for extra power to increase the heat of the dry scrubber 208 during the treatment, the controller 106 will also reduce or stop the flow of the $N_2$ and $H_2$ gas when no wafer is present.

In one embodiment, the vacuum pump controller 106 may have a low or inactive default state. In this embodiment, upon detecting a cassette present signal from load lock A and/or load lock B, controllers in the vacuum pump controller will send a control signal to the vacuum pump to ramp up the speed voltage of the vacuum pump from 2.5V to, for example, 5V. Increasing the speed voltage of the vacuum pump from 2.5V to other higher voltages is also useful. In another embodiment, the vacuum pump controller 106 may have a high or active default state. In this embodiment, upon detecting a cassette absent signal from load lock A and load lock B, controllers in the vacuum pump controller will send a control signal to the vacuum pump to ramp down the speed voltage of the vacuum pump from 5V to, for example, 2.5V. Lowering the speed voltage of the vacuum pump from 5V to other lower voltages is also useful.

In yet other embodiments, where the vacuum pump controller 106 has a high or active default state; the vacuum pump controller 106 may send further control signals to reduce or stop the inflow of $H_2$ fuel and/or $N_2$ purge gas and/or cooling water when there is no wafer present. Conversely, where the vacuum pump controller 106 has a low or inactive default state, the vacuum pump controller 106 will increase the inflow of $H_2$ fuel and/or $N_2$ purge gas and cooling water when the controller detects that cassettes are present in load lock A and/or load lock B. Controllers in the vacuum pump controller 106 may send further control signals to control the exhaust diversion or 3-way valves, and whether a heater is turned on or off depending on whether cassettes are present or absent in one or both load locks.

Regardless of the default state of the controller, given that the speed of the vacuum pump 110 is only ramped up when a cassette is present in load lock A and/or load lock B, this conserves the use of electricity. Furthermore, given that the dry scrubber is bypassed and the heater is only turned on when a cassette present, this results in further reduction of electricity. In addition, the use of vacuum pump controller 106 also conserves the use of $H_2$, $N_2$ purge gas and/or cooling water as the controller reduces or stops the flow of $H_2$, $N_2$ purge gas and/or cooling water when there are no cassettes in the load locks. In one embodiment, vacuum pump controller 106 may be used in, for example, an Ebara vacuum pump. In other embodiments, vacuum pump controller 106 may also be used in other types of subfab apparatus or accessories.

In yet other embodiments, the vacuum pump controller 106 may be used in a method for making a device. The method includes providing a substrate and processing the substrate using a vacuum pump having a vacuum pump controller. The vacuum pump controller has detectors for detecting whether a cassette is present in a semiconductor processing load lock and controllers for sending control signals to the vacuum pump to control the speed voltage of the vacuum pump. The vacuum pump controller according to the method may further include controllers for controlling one or more exhaust diversion or 3-way valves, the flow of H2 fuel gas, $N_2$ purge gas and/or cooling water and/or a heater depending on whether there are any cassettes in the load lock.

Figure 3:
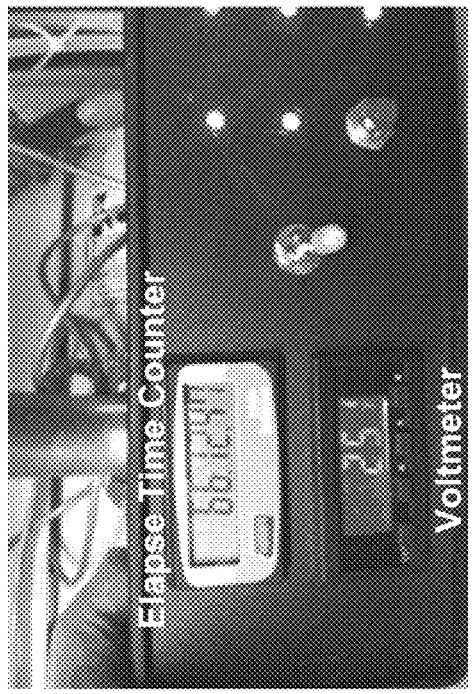
FIG. 3 shows the energy savings hours of an embodiment of a vacuum pump controller.
Figure 3:
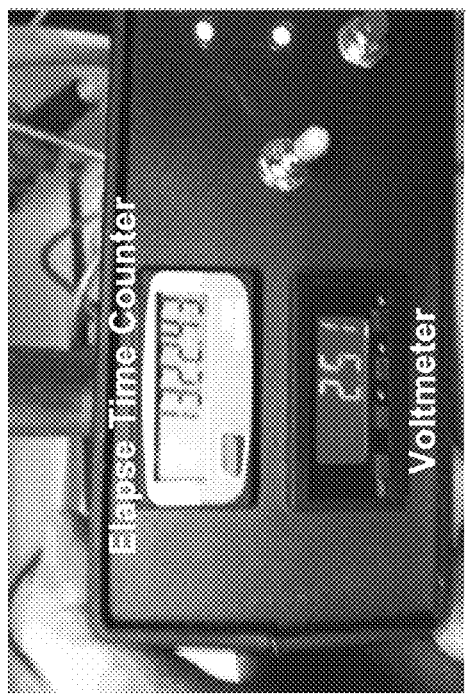

FIG. 3 shows an example of the energy saving hours of an embodiment of the vacuum pump controller 106. As shown, the energy saving hours is from day one to day eight. The figure shows two photos of an elapse time counter which shows the down or idle time of the vacuum pump. As shown, on day two at 14:35 the elapse time counter reading is 13 hours 22 minutes and 43 seconds, whereas on day eight at 16:10, the elapse time counter reading is 66 hours, 12 minutes and 45 seconds. The elapse time counter was set to 00.00.00 at 10:35 on day one. As such, the total hours accumulated in the evaluation is 173.58 hours. However, as shown by the elapse time counter, the total hours captured during idle or down time (i.e., when the speed of the vacuum pump is reduced) is about 66.2 hours. Therefore, the system was in idle mode 38.14% of the total hours. Translating such percentage to a 24 hour timeframe, this means the system was in idle mode a daily average of 9.15 hours.

Figure 4:
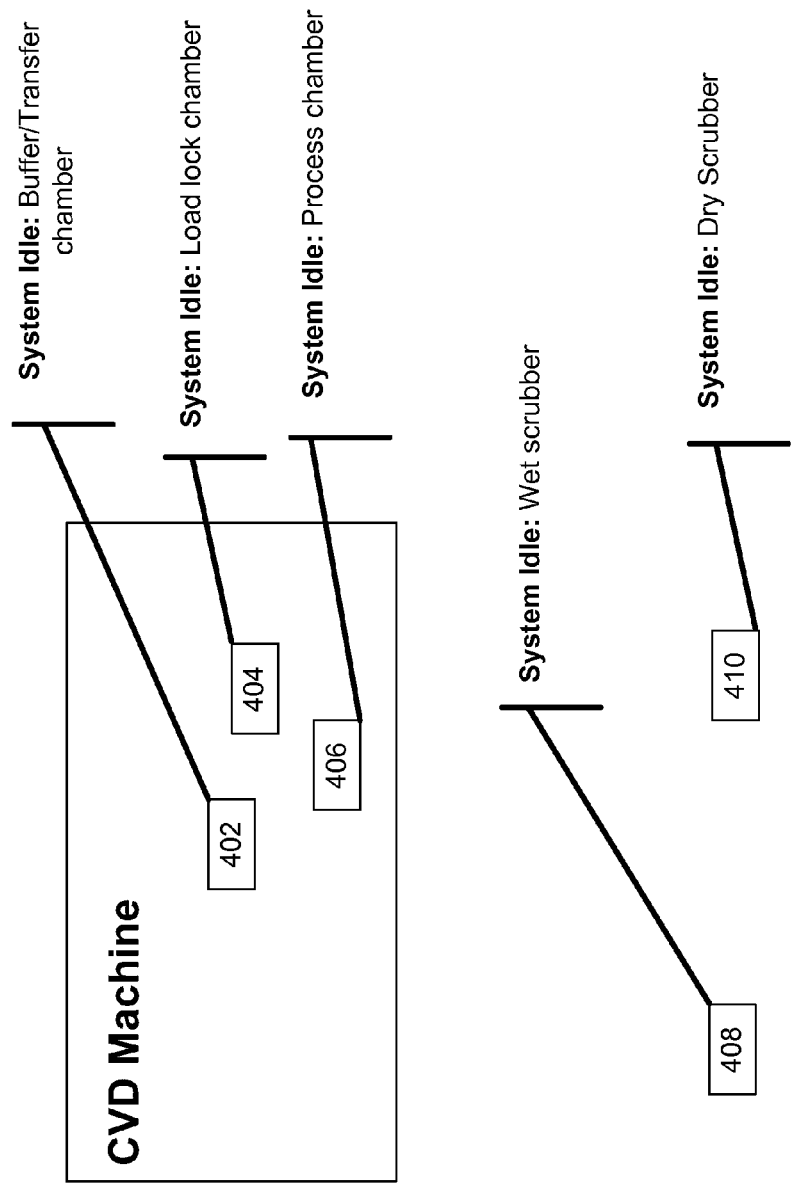
FIG. 4 shows various energy savings applications by the vacuum pump controller.

FIG. 4 shows various energy savings applications by the vacuum pump controller 106. As shown in application 402, the vacuum pump controller may be utilized when the system is in idle state, e.g., the wafer is in a buffer or transfer chamber, to reduce the buffer/transfer chamber vacuum pump speed and also the flow of the $N_2$ purge gas together with vacuum pump 110. Application 404 shows that when the system is in idle mode, the vacuum pump controller may be used to reduce the load lock chamber vacuum pump speed.

Application 406 shows that when the system is in idle mode, the vacuum pump controller may be used to reduce the process chamber vacuum pump speed as well as the pump purge gas flow, i.e., less $N_2$ gas is needed as there is no poisonous and/or flammable and/or corrosive gas to dilute. Since the pump speed is reduced during idle mode, this has the added benefit of reducing pump parts wear and tear, thereby improving the pump survival rate. To further enhance pump survival rate, the controller may further activate sensors to protect the pump seal when no wafer is present by maintaining a small $N_2$ flow of about 5 slm as compared to the normal flow of about 70 slm when a wafer is present.

Application 408 shows that when the system is idle, the vacuum pump controller may also be used to reduce the water used in the wet scrubber. Application 410 shows that when the system in idle mode, the vacuum pump controller may be further used to reduce the temperature setting of the dry scrubber as well as $N_2/H_2$ gas flow.

The vacuum pump controller 106 may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of the equivalency of the claims are intended to be embraced therein.

What is claimed is:

1. A vacuum pump controller comprising:
   detectors for detecting whether a cassette is present in a semiconductor processing load lock; and
   controllers, wherein the controllers send control signals to a vacuum pump to control a speed voltage of the vacuum pump, and
   when no wafer is present,
      the controllers further send control signals to control 3-way valves to bypass a dry scrubber and divert at least one of non-abatable gas and purge gas into a main exhaust, and
   when the wafer is present,
      the controllers further send control signals to control the 3-way valves for diverting at least one of waste gas and purge gas from the vacuum pump into the dry scrubber.

2. The vacuum pump controller of claim 1 wherein the vacuum pump speed voltage is reduced when no cassette is present in the load lock.

3. The vacuum pump controller of claim 2 wherein the vacuum pump speed voltage is ramped up when the cassette is present in the load lock.

4. The vacuum pump controller of claim 3 wherein the controller further sends control signals to control the supply of $N_2$ and $H_2$ gases.

5. The vacuum pump controller of claim 4 wherein the $N_2$ and $H_2$ gas supply is reduced or completely stopped when no wafer is present.

6. The vacuum pump controller of claim 4 wherein the controller further sends control signals to reduce the supply of $N_2$ gas to 5 slm to protect a vacuum pump seal when no wafer is present.

7. The vacuum pump controller of claim 1 wherein the controller further sends control signals to control the supply of cooling water into a wet scrubber.

8. The vacuum pump controller of claim 1 wherein the detector of the vacuum pump controller detects at least two load locks connecting to slow and fast pump valves.

9. The vacuum pump controller of claim 1 wherein the controllers further send control signals to control a heater, wherein the heater is only turned on when the cassette is present.

10. A vacuum pump controller comprising:
    detectors for detecting whether a cassette is present in a semiconductor processing load lock; and
    controllers for sending control signals to a vacuum pump to control a speed voltage of the vacuum pump, wherein the vacuum pump speed voltage is ramped up when the cassette is present in the load lock, and wherein
       the controllers further send control signals to control the supply of $N_2$ and $H_2$ gases,
       the controllers further send control signals to control 3-way valves for diverting at least one of waste and purge gases from the vacuum pump into a dry scrubber when a wafer is present, and
       the controllers further send control signals to control the 3-way valves to bypass the dry scrubber and divert at least one of non-abatable and purge gases into a main exhaust when no wafer is present.

11. The vacuum pump controller of claim 10 wherein the vacuum pump controller functions are integrated into the vacuum pump controller by means of software.

12. A method of making a device comprising:
    providing a substrate; and
    processing the substrate using a vacuum pump having a vacuum pump controller, wherein the vacuum pump controller comprises
       detectors for detecting whether a cassette is present in a semiconductor processing load lock, and
       controllers, wherein the controllers send control signals to a vacuum pump to control a speed voltage of the vacuum pump, and
       when no wafer is present, the controllers further send control signals to control 3-way valves to bypass a dry scrubber and divert at least one of non-abatable gas and purge gas into a main exhaust, and when the wafer is present, the controllers further send control signals to control the 3-way valves for diverting at least one of waste gas and purge gas from the vacuum pump into the dry scrubber.

13. The method of claim 12 further comprising reducing the vacuum pump speed voltage when no cassette is present in the load lock.

14. The method of claim 12 further comprising ramping up the vacuum pump speed voltage when the cassette is present in the load lock.

15. The method of claim 12 wherein the controllers further send control signals to control the supply of $N_2$ and $H_2$ gases.

16. The method of claim 15 further comprising reducing or stopping the supply of $N_2$ and $H_2$ gases when no wafer is present.

17. The method of claim 15 further comprising reducing the supply of $N_2$ gas to 5 slm to protect a vacuum pump seal when no wafer is present.

18. The method of claim 12 wherein the controllers further send control signals to control the supply of cooling water into a wet scrubber.

19. A method of making a device comprising:

providing a substrate; and processing the substrate using a vacuum pump having a vacuum pump controller, wherein the vacuum pump controller comprises detectors for detecting whether a cassette is present in a semiconductor processing load lock, and controllers for sending control signals to the vacuum pump to control a speed voltage of the vacuum pump, and wherein the controllers further send control signals to control the supply of $N_2$ and $H_2$ gases, the controllers further send control signals to control 3-way valves for diverting at least one of waste and purge gases from the vacuum pump into a dry scrubber when a wafer is present, and the controllers further send control signals to control the 3-way valves to bypass the dry scrubber and divert at least one of non-abatable and purge gases into a main exhaust when no wafer is present.

20. A vacuum pump controller comprising:

detectors for detecting whether a cassette is present in a semiconductor processing load lock; and controllers, wherein the controllers send control signals to a vacuum pump to control a speed voltage of the vacuum pump and the supply of $N_2$ and $H_2$ gases and cooling water, and wherein when no cassette is present in the load lock, the vacuum pump speed voltage is reduced and the supply of $N_2$ and $H_2$ gases and cooling water is reduced or completely stopped, when no wafer is present, the controllers further send control signals to control 3-way valves to bypass a dry scrubber and divert at least one of non-abatable gas and purge gas into a main exhaust, and when the wafer is present, the controllers further send control signals to control 3-way valves for diverting at least one of waste gas and purge gas from the vacuum pump into the dry scrubber.

* * * * *